(12) United States Patent
Lee

(10) Patent No.: US 9,698,713 B2
(45) Date of Patent: Jul. 4, 2017

(54) APPARATUS FOR CORRECTING OFFSET OF CURRENT SENSOR

(71) Applicant: LSIS CO., LTD., Gyeonggi-do (KR)

(72) Inventor: Sun-Woo Lee, Gyeonggi-do (KR)

(73) Assignee: LSIS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/071,066

(22) Filed: Mar. 15, 2016

(65) Prior Publication Data

US 2016/0301341 A1    Oct. 13, 2016

(30) Foreign Application Priority Data

Apr. 9, 2015  (KR) .................. 10-2015-0050141

(51) Int. Cl.
*H02P 6/16* (2016.01)
*H02P 6/28* (2016.01)
(Continued)

(52) U.S. Cl.
CPC ............ *H02P 6/28* (2016.02); *G01R 19/0092* (2013.01); *G01R 35/005* (2013.01); *H02P 21/22* (2016.02);
(Continued)

(58) Field of Classification Search
CPC  H02P 21/36; H02P 6/002; H02P 1/30; H02M 7/68; H02M 5/04
(Continued)

(56) References Cited

U.S. PATENT DOCUMENTS 8,953,716 B1 * 2/2015 Venkatasubramanian
............................ H04L 25/061
375/254
2003/0094936 A1 * 5/2003 Nam ...................... G01R 23/02
324/76.29
(Continued)

FOREIGN PATENT DOCUMENTS

JP      2006-136053 A    5/2006
JP      2009-273302 A    11/2009
JP      2013-46514 A     3/2013

OTHER PUBLICATIONS

European Search Report dated on Sep. 20, 2016 corresponding to application No. 16159161.5-1568.
(Continued)

*Primary Examiner* — Eduardo Colon Santana
*Assistant Examiner* — Gabriel Agared
(74) *Attorney, Agent, or Firm* — Nath, Goldberg & Meyer; Jerald L. Meyer; Christopher Thomas

(57) ABSTRACT

Disclosed are embodiments of an apparatus for correcting an offset of a current sensor. The apparatus includes an inverter, a detector, and a RMS calculator, and a controller. The RMS calculator converts the high frequency component extracted from the filter into an effective (RMS) value. The controller, if the effective (RMS) value of the d-axis or q-axis current transformed by the RMS calculator is larger than a preset reference, increases/decreases a currently-set DC offset of each of the current sensors by a certain amount, and replaces the currently-set DC offsets with a DC offset corresponding to a smallest one of the effective (RMS) values of the d-axis or q-axis transformed by the RMS calculator, thereby correcting each of the current sensors. Accordingly, a pulsation in an output torque in controlling an electric motor can be effectively prevented.

4 Claims, 3 Drawing Sheets

(51) Int. Cl.
*G01R 35/00* (2006.01)
*G01R 19/00* (2006.01)
*H02P 21/22* (2016.01)
*B60L 3/00* (2006.01)
*B60L 11/18* (2006.01)
*G01R 31/42* (2006.01)
*G01R 31/00* (2006.01)
*H02P 27/08* (2006.01)

(52) U.S. Cl.
CPC .............. *B60L 3/0038* (2013.01); *B60L 11/18* (2013.01); *B60L 2240/529* (2013.01); *G01R 31/006* (2013.01); *G01R 31/42* (2013.01); *H02P 27/08* (2013.01)

(58) Field of Classification Search
USPC .................................................... 318/400.04
See application file for complete search history.

(56) References Cited

U.S. PATENT DOCUMENTS

| | | | |
|---|---|---|---|
| 2009/0040665 A1* | 2/2009 | Elms | H02H 1/0015 361/42 |
| 2009/0059446 A1* | 3/2009 | Matsui | H02P 29/0241 361/31 |
| 2009/0134835 A1 | 5/2009 | Welchko et al. | |
| 2011/0103110 A1* | 5/2011 | Godridge | H02J 3/386 363/74 |
| 2011/0238245 A1* | 9/2011 | Gallegos-Lopez | B60L 11/14 701/22 |
| 2012/0256580 A1* | 10/2012 | Yu | H02P 29/032 318/779 |
| 2013/0049655 A1 | 2/2013 | Takai et al. | |
| 2013/0106332 A1 | 5/2013 | Williams et al. | |
| 2013/0170256 A1* | 7/2013 | Choi | H02M 7/48 363/37 |
| 2013/0279213 A1* | 10/2013 | Saeki | H02M 7/68 363/37 |
| 2015/0015171 A1* | 1/2015 | Nishibata | H02P 29/0038 318/400.15 |
| 2015/0244249 A1* | 8/2015 | Chen | H02M 1/12 363/41 |

OTHER PUBLICATIONS

Japanese Office Action dated Apr. 4, 2017 in corresponding with the counterpart Japaneses Patent Application.

* cited by examiner

APPARATUS FOR CORRECTING OFFSET OF CURRENT SENSOR

CROSS REFERENCE TO RELATED APPLICATION

This application claims the benefit of Korean Patent Application No. 10-2015-0050141, filed on Apr. 9, 2015, entitled "APPARATUS FOR CORRECTING OFFSET OF CURRENT SENSOR", which is hereby incorporated by reference in its entirety into this application

BACKGROUND

1. Technical Field

The present disclosure relates to an apparatus for correcting an offset of a current sensor. More specifically, the present disclosure relates to an apparatus for correcting an offset of a current sensor that is capable of effectively preventing a pulsation in an output torque in controlling an electric motor in such a manner that a DC offset of a current sensor is corrected while the electric motor is being driven, which may cause the pulsation in the output torque when a current is measured using the current sensor.

2. Description of the Related Art

Recently, a hybrid electric vehicle (HEV) and an electric vehicle (EV) are attracting attention as eco-friendly vehicle. HEVs employ an electric motor driven by electricity, in addition to a traditional internal combustion engine as power sources.

Specifically, an internal combustion engine works as a primary power source, while an electric motor works as a secondary power source by inverting a DC power from a battery to a AC power by an inverter.

EVs have an electric motor only as a primary power source. The motor may be supplied with an AC power inverted by an inverter from a DC power. For HEVs and EVs, an electric motor control unit (MCU) controls precisely an electric motor based on a detected output torque, a sensed current flowing in the motor, and the like.

There may be a difference between a current flowing in an electric motor sensed by a current sensor (hereinafter referred to as "electric motor current") and a current actually flowing in the motor. This difference is referred to as an "offset" of the current sensor. The offset of the current sensor is a small amount of current necessary for operating the current sensor. Since the electric motor current sensed by the current sensor includes a current actually flowing in the electric motor plus the offset, it is necessary to compensate for the offset in the electric motor current.

If an electric current is provided to the control unit (MCU) without compensating for the offset, pulsation of the output torque of the electric motor may occur due to an error between the electric motor and a current actually flowing. As a result, the entire system may become unstable.

To avoid this problem, it is typical to set an offset in advance at the beginning of driving the motor and then compensate for the offset of the current sensed by the current sensor. However, the offset is likely to vary due to an external noise, elapse of years, an ambient temperature change, the current sensor aging, etc.

Therefore, via the conventional static offset compensation, there eventually occurs an error between the sensed current and the actual current. This may result pulsation in the output torque of the motor output, and thus the motor cannot be controlled stably. Further, if the physical resonation point of the entire system such as an EV is in synchronization with the pulsation frequency of the output torque, the EV may become unstable.

SUMMARY

An aspect of an embodiment of the present invention is to provide an apparatus for correcting an offset of a current sensor that is capable of effectively preventing a pulsation in an output torque in controlling an electric motor in such a manner that a DC offset of a current sensor is corrected while the electric motor is being driven, which may cause the pulsation in the output torque when a current is measured using the current sensor.

It is one aspect of an embodiment of the present disclosure to provide an apparatus for correcting an offset of a current sensor, including: an inverter configured to convert a DC power into an three-phase AC current to supply it to an electric motor; a current detector including a plurality of current sensors for sensing current output from the inverter; a filter configured to transform the current sensed by the current detector into d-q axis current and to filter the transformed d-axis or q-axis current to extract a high frequency component therefrom; a RMS (root mean square) calculator configured to convert the high frequency component extracted from the filter into an effective (RMS) value; and a controller configured to, if the effective (RMS) value of the d-axis or q-axis current transformed by the RMS calculator is larger than a preset reference, increase/decrease a currently-set DC offset of each of the current sensors by a certain amount and replace the currently-set DC offsets with a DC offset corresponding to a smallest one of the effective (RMS) values of the d-axis or q-axis transformed by the RMS calculator, thereby correcting each of the current sensors.

At least two of the three-phase AC currents output from the inverter may have their respective current sensors.

The filter may include a high pass filter (MPF).

The controller may maintain the currently-set DC offsets if the effective (RMS) value is smaller than the preset reference.

BRIEF DESCRIPTION OF THE DRAWINGS

The above and other aspects, features and advantages of the present disclosure will become apparent from the following description of exemplary embodiments given in conjunction with the accompanying drawings, in which.

DETAILED DESCRIPTION

Figure 1:
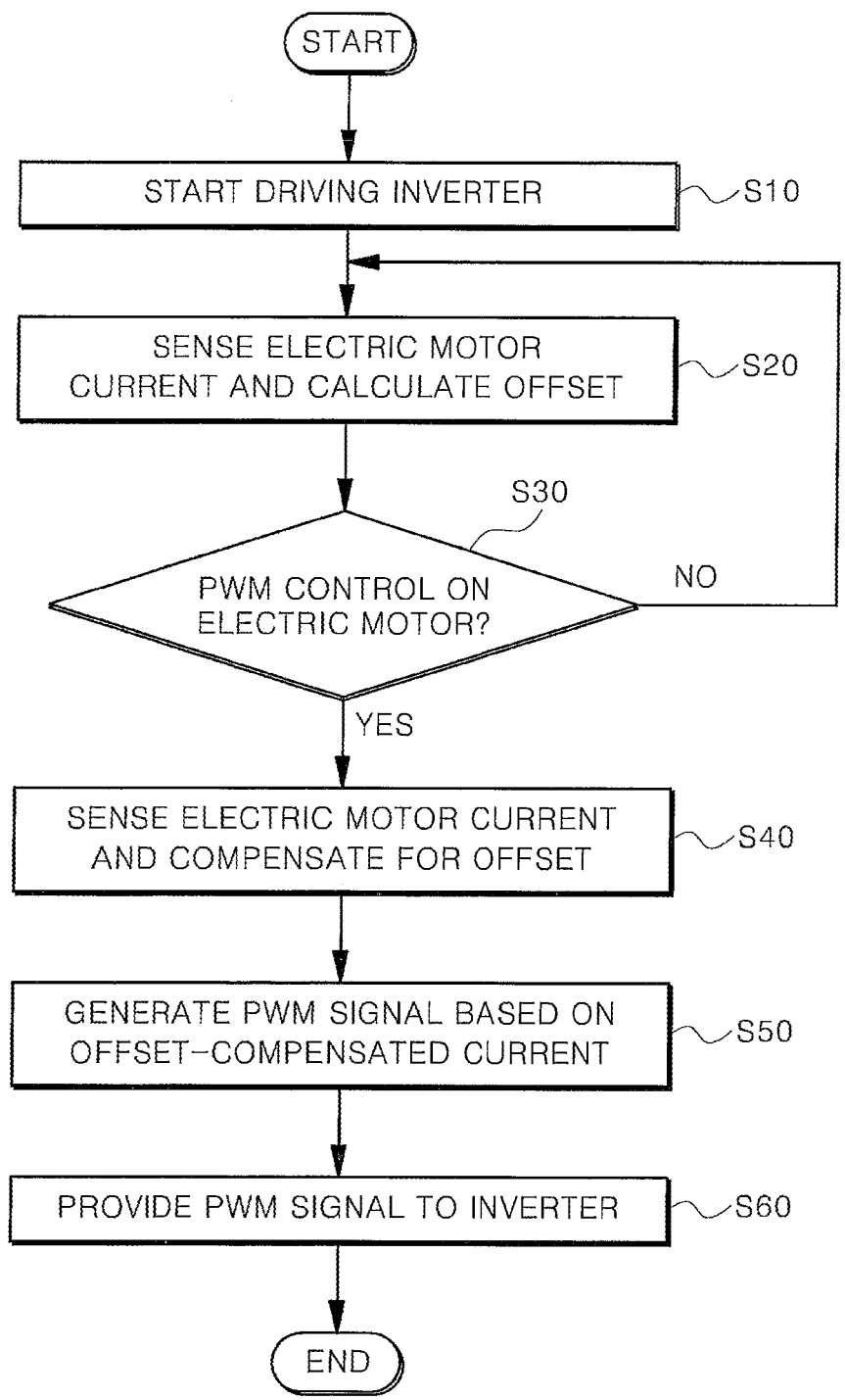
FIG. 1 is a flow chart for illustrating a method of compensating for an offset of a current sensor in the prior art.

The above objects, features, and advantages will be described in detail with reference to the accompanying drawings and therefore, the technical ideas of the present disclosure can be easily practiced by a person with ordinary skill in the art to which the present disclosure pertains. Further, when it is determined that the detailed description of the known art related to the present disclosure may obscure the gist of the present disclosure, the detailed description thereof will be omitted.

Hereinafter, exemplary embodiments of the present disclosure will be described in detail with reference to the accompanying drawings. The embodiments of the present disclosure may be modified in many different forms and the scope of the disclosure should not be limited to the embodiments set forth herein. Rather, these embodiments are provided so that this disclosure will be thorough and complete, and will fully convey the concept of the disclosure to those skilled in the art. Throughout the drawings, like reference numerals refer to like parts throughout the various figures and embodiments of the present disclosure.

Hereinafter, various embodiments of the present disclosure will be described in detail with reference to the accompanying drawings.

FIG. 1 is a flow chart for illustrating a method of compensating for an offset of a current sensor in the prior art.

Referring to FIG. 1, according to the method in the prior art, an offset of a current sensor is detected repeatedly, and then the offset can be compensated for appropriately.

Specifically, in the beginning of driving of an EV, for example, (e.g., when an EV is started up), an electric motor, an inverter, a current sensor and a current controller (e.g., MCU) may start to work (S10).

Once the inverter and the electric motor, etc., are started up, the current sensor detects a current flowing in the electric motor and sends a feedback signal to the current controller. The current controller calculates an offset based on the current detected by the current sensor (S20).

Then, the current controller determines whether pulse width modulation (PWM) control is performed on the electric motor (S30). In other words, the current controller determines whether the inverter supplies the electric motor current for driving the electric motor. This determination may be made regularly at a predetermined interval or randomly.

If it is determined in step S30 that the PWM control on the motor is being performed, the current controller compensates for the sensed electric motor current based on the calculated offset in step S20 (S40). The offset may have a positive (+) or a negative (−) value. Accordingly, the offset may be subtracted from or added to the sensed electric motor current.

Upon the completion of the offset compensation for the electric motor, the current controller generates a PWM signal based on the offset-compensated motor current (S50). Then, the controller may output the PWM signal to the inverter which, in turn, feeds an AC signal as an electric motor current to the motor (S60).

If it is determined in step S30 that no PWM control on the motor is being performed, the process returns to step S20, where the current controller calculates a new offset from an electric motor current sensed by the current sensor.

Since no PWM control is being performed, no electric current is supposed to be flow in the electric motor. However, if the current sensor senses a current value, the current value is calculated as a new offset.

This new offset is obtained since the offset has been changed due to, for example, an external noise, elapse of years, an ambient temperature change. Once such a new offset is obtained, the current controller repeats steps S30 to S60, thereby controlling the electric motor stably.

According to the method in the prior art, the control system of the electric motor is initialized and an offset of the current sensor is measured. Then, it is determined whether the pulse width modulation (PWM) control is performed during the operation of the control device when the electric motor is being controlled.

If the PWM control is being performed, the previously measured offset is used for controlling the electric motor, because it is difficult to accurately extract the offset component only from the measured current value while current is flowing in the electric motor.

On the other hand, if the PWM control is not being performed during the control of the electric motor, a current value measured by the current sensor can be used as a new offset of the current sensor for controlling the electric motor, because no current is flowing in the electric motor.

Unfortunately, according to the method in the prior art, it is impossible to calculate a new offset of the current sensor while a vehicle keeps traveling, since the PWM control is being performed. Accordingly, there is a problem in that the offset of the current sensor becomes inaccurately while a vehicle keeps traveling.

To solve the above problem, a feature of an embodiment of the present disclosure is to effectively prevent a pulsation in an output torque in controlling an electric motor in such a manner that a DC offset of a current sensor is corrected while the electric motor is being driven, which may cause the pulsation in the output torque when a current is measured using a current sensor.

That is, an embodiment of the present disclosure relates to a technique to correct a DC offset of a current sensor which may cause a pulsation in an output torque when a current is measured using a current sensor in controlling an electric motor. When the offset of a current sensor changes due to factors such as ambient temperature in measuring a current using a current sensor, an error between the changed offset and the measured offset causes a pulsation in an output torque in an electric motor. Accordingly, an embodiment of the present disclosure is to prevent such a pulsation in the output torque in controlling the electric motor, which may occur when an erroneous offset is applied.

Figure 2:
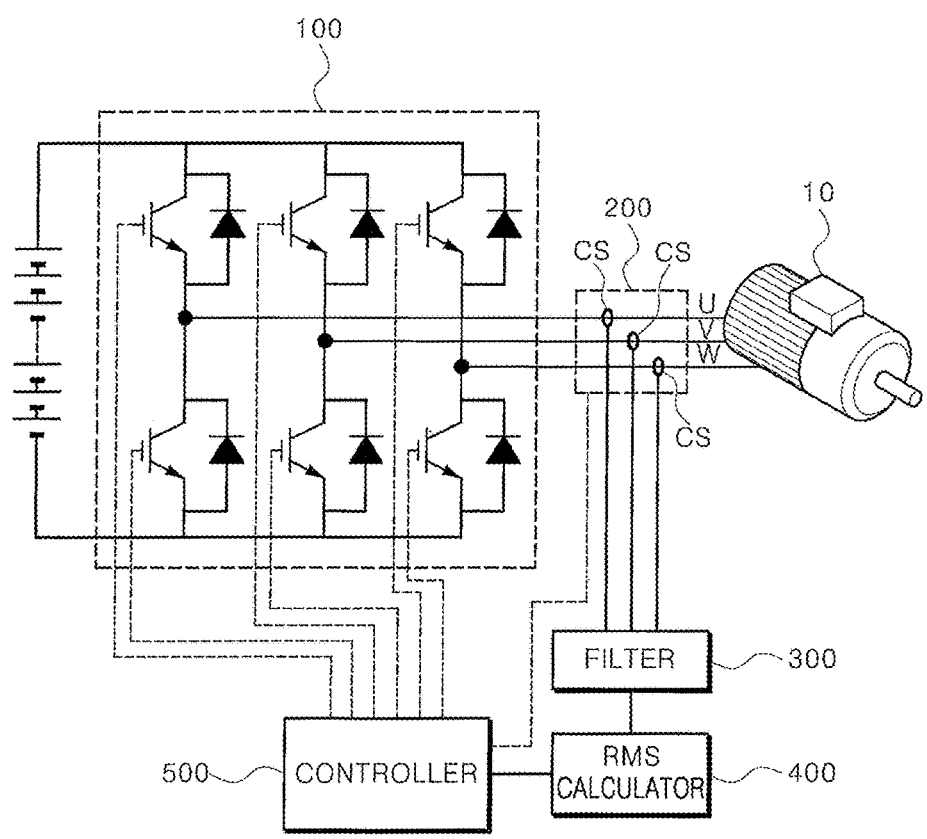
FIG. 2 is a step diagram of an apparatus for correcting an offset of a current sensor according to one embodiment of the present disclosure.

FIG. 2 is a step diagram of an apparatus for correcting an offset of a current sensor according to one embodiment of the present disclosure.

Referring to FIG. 2, an apparatus for correcting an offset of a current sensor according to one embodiment of the present disclosure may mainly include an inverter 100, a current detector 200, a filter 300, a RMS calculator 400 and a controller 500.

The inverter 100 may convert a DC power to a three-phase AC power (current) to supply a driving current to an electric motor 10. By doing so, the electric motor 10 is subject to pulse width modulation (PWM) control according to a PWM signal supplied from the controller 500.

That is, the inverter 100 switches a plurality of semiconductor switching elements therein to convert a DC power to an AC power according to a PWM signal received from the controller 500, and supplies the AC current to the electric motor 10 to perform PWM control on the electric motor 10.

In this regard, the PWM control refers to control over the electric motor current by the inverter 100 based on the PWM signal. As used herein, the term "electric motor current" refers to a current flowing in the electric motor 10.

Each of the semiconductor switching elements may be turned on and off according to a signal input its gate terminal. For example, the semiconductor devices may include metal oxide semiconductor field effect transistors (MOSEFTs), silicon coupled rectifiers (SCRs), insulated gate bipolar transistors (IGBTs) or the like.

The inverter 100 may be a typical switching circuit that includes six semiconductor switching elements in three-phase full bridge connection and converts a DC bus voltage to a three-phase AC to supply the three-phase AC to the electric motor 10.

Typically, the inverter 100 includes a plurality of semiconductor switching elements for an inverter, and smoothes a DC power by turning on/off the semiconductor switching elements to invert it into a three-phase AC power having a predetermined frequency.

There are three pairs connected in parallel, each of the pairs includes an upper semiconductor switching element and a lower semiconductor switching element connected in series. A diode is connected to each of the semiconductor switching element in anti-parallel.

A U-phase arm comprises of NPN transistors connected in series, a V-phase arm comprises of NPN transistors connected in series, and a W-phase arm comprises of NPN transistors connected in series. Between a collector and an emitter of each of the NPN transistors, there is disposed a diode to allow a current to flow from the emitter to the collector.

When a switching control signal is input from the controller 500 to the gate of each of the semiconductor switching elements, each semiconductor switching element performs switching operation. As a result, a three-phase AC power having a predetermined frequency is output.

The three-phase AC power having the predetermined frequency is applied to the U-phase, V phase, and W phase of the electric motor 10. The electric motor 10 includes a stator and a rotor. The three-phase AC power is applied to the coil of each of the phases (U-phase, V-phase and W-phase), so that the rotor rotates. The electric motor 10 may include, but is not limited to, a three-phase electric motor such as a BLDC electric motor, a synchronous reluctance motor (synRM motor) or the like.

The current detector 200 detects a current outputted from the inverter 100. The current detector 200 may include a plurality of current sensors CS to sense a current to be supplied to the electric motor 10 (an electric motor current). Each of the current sensors CS is disposed between the inverter 100 and motor 10 at respective one of three-phase connection lines. Each of the sensors CS senses respective three-phase currents and sends a feedback signal to the controller 500.

Preferably, the current detector 200 converts analog currents sensed by plurality of the current sensors CS to digital currents. However, the present disclosure is not limited thereto. In one example, the current detector 200 output analog currents sensed by the plurality of current sensors CS as they are, and the analog current may be converted by an additional analog-to-digital converter (ADC) or the filter 300.

The current sensor CS senses a three-phase current flowing from the inverter 100 to the electric motor 10 and outputs a flux current component and a torque current component. The flux current component is proportional to the flux of the rotator, while the torque current component is proportional to the output torque of the motor 10. The phase of the flux current component is different from the phase of the torque current component by ninety-degree.

Preferably, at least one of the current sensors CS may be disposed at least two (phase-a and phase-b, phase-b and phase-c, phase-a and phase-c, and phase-a and phase-c) of the three-phase AC currents output from the inverter 100.

The current sensor may be implemented in a current transformer (CT) having a hollow, quadrangular or cylindrical core.

The filter 300 may transform the sensed three-phase currents from the current detector 200 into two-phase currents, that is, d-axis and q-axis currents. Then, the filter 300 may filter the d-axis and/or q-axis currents to extract a high frequency component therefrom.

The filter 300 may include, but is not limited to, a high pass filter (HPF) configured to pass the high frequency component but step a low frequency component. In one example, the filter 300 may be a band pass filter (BPF) to extract a predicted (or predetermined) pulsation frequency.

The RMS calculator 400 converts the high frequency component of the d-axis and/or q-axis currents from the filter 300 to an effective RMS (Root Mean Square) value.

The controller 500 controls overall operations of the inverter 100. In particular, the controller 500 compares the effective (RMS) value from the RMS calculator 400 with a preset reference. When the effective (RMS) value is larger than the preset reference, the controller 500 may increase or decrease each of currently-set DC offsets for the plurality of the current sensors by a certain amount. Then, the controller 500 may apply the increased or decreased DC offset, and replace the currently-set DC offsets with a DC offset corresponding to the smallest effective (RMS) value of the d-axis and/or q-axis converted via the current sensor 200 and the filter 300 and the RMS calculator 400, thereby correcting the current sensors CS.

Otherwise, the controller 500 may be further configured, when the effective (RMS) value is equal to or smaller than the preset reference, to maintain the currently-set DC offsets for the current sensors CS.

Although the filter 300, the RMS calculator 400 and the controller 500 are implemented separately, the present disclosure is not limited thereto. In one example, the controller 500 may perform the functionality of the filter 300 and RMS calculator 400 in software.

In this case, the controller 500 may include capability of converting the sensed analog current from the current detector 200 to a digital current, and capability of converting the digital three-phase currents into the two-phase currents, that is, the d-axis, and q-axis currents.

Furthermore, the filter 300 and RMS calculator 400 may be implemented in software or in hardware.

Hereinafter, a method for correcting an offset of a current sensor according to an exemplary embodiment of the present disclosure will be described in detail.

Figure 3:
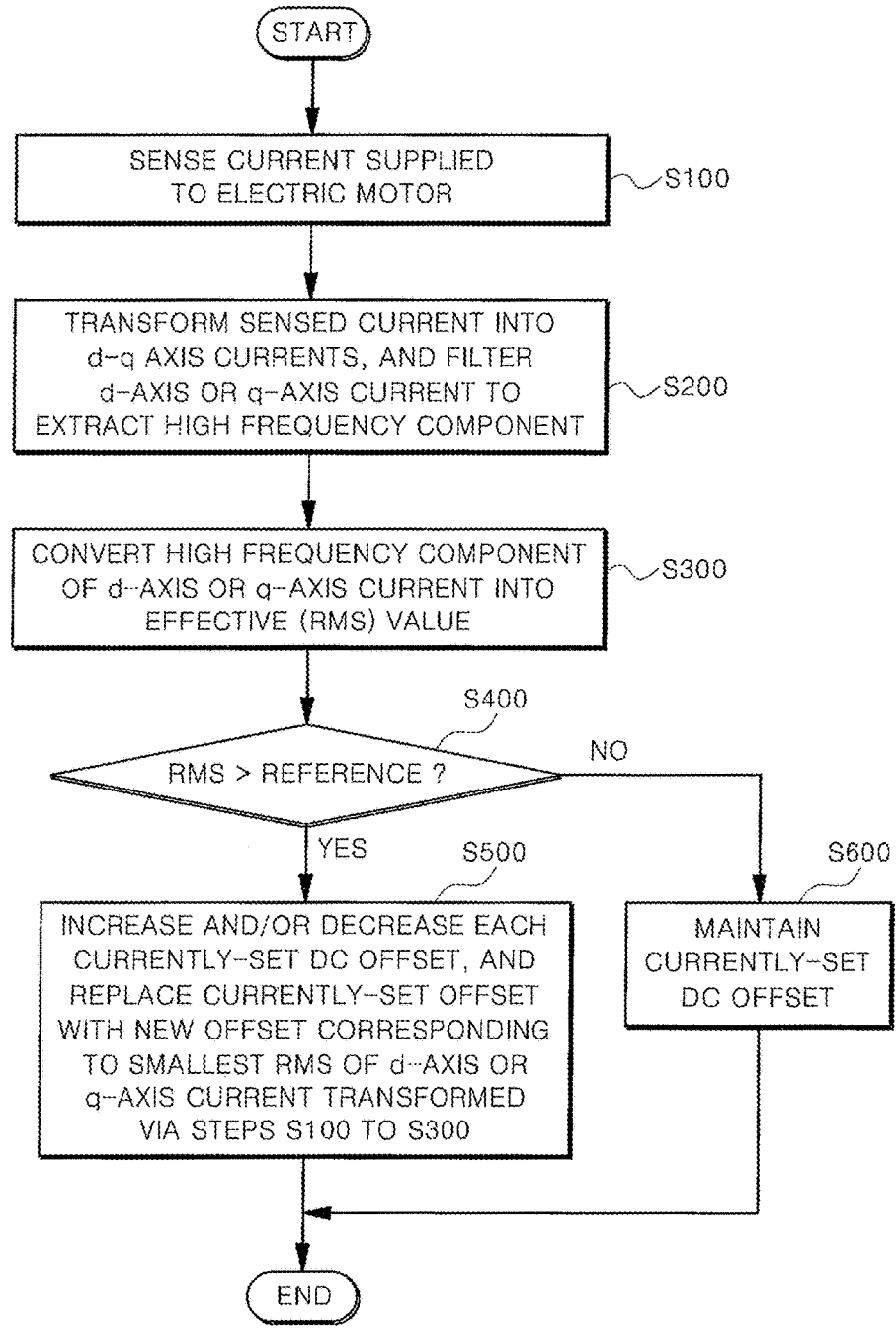
FIG. 3 is a flow chart for illustrating a method of correcting an offset of a current sensor according to an embodiment of the present disclosure.

FIG. 3 is a flow chart for illustrating a method for correcting an offset of a current sensor according to an exemplary embodiment of the present disclosure. It is to be noted that the controller 500 is the subject of steps of the method, unless explicitly stated otherwise.

Referring to FIGS. 2 and 3, the method of correcting an offset of a current sensor according to an exemplary embodiment of the present disclosure starts with step S100, where the current sensors CS of the current detector 200 senses the currents to the motor 10. Preferably, the current sensors CS of the current detector 200 may sense at least two of the three-phase currents to the motor.

Thereafter, the filter 300 transforms the sensed current in step S100 to the d-q axis currents, and filters d-axis and/or q-axis currents to extract a high frequency component (step S200).

Then, the RMS calculator 400 converts the high frequency component of the d-axis and/or q-axis currents extracted in step S200 into the effective (RMS) value (step S300). Then, the controller 500 compares the effective (RMS) value with a preset reference (step S400).

The preset reference is defined as a minimal limit to cause a pulsation in the output torque of the electric motor. The preset reference may vary depending on a rated output of the motor.

If it is determined in step S400 that the effective (RMS) value of the d-axis and/or q-axis currents is larger than the preset reference, the controller 500 increases or decreases currently-set DC offset for each of the plurality of the current sensors. Then, the currently-set DC offsets is replaced with a DC offset corresponding to the smallest effective (RMS) value of the d-axis and/or q-axis currents converted via steps S100 to S300 (step S500).

If the effective (RMS) value of the d-axis or q-axis current transformed in step S300 is larger than the preset reference, the controller 500 increases the currently-set DC offset for each of the plurality of the current sensors CS by a certain amount. When the effective (RMS) value of the q-axis or d-axis current is decreased, the controller 500 increases the DC offset by a certain amount until the effective (RMS) value decreases and increases again. Then, the controller 500 replaces the currently-set DC offsets with a DC offset corresponding to the smallest effective (RMS) value of the q-axis or d-axis current.

If the effective (RMS) value of the q-axis or d-axis current transformed in step S300 is larger than the preset reference, the controller 500 increases the currently-set DC offset for each of the plurality of the current sensors CS by a certain amount. When the effective (RMS) value of the q-axis or d-axis current is increased, the controller 500 decreases the currently-set DC offset of each of the current sensors CS of the current detector 200 by a certain amount.

When the effective (RMS) value of the q-axis or d-axis current is decreased, the controller 500 decreases the DC offset by a certain amount until the effective (RMS) value decreases and increases again. Then, the controller 500 replaces the currently-set DC offsets with a DC offset corresponding to the smallest effective (RMS) value of the q-axis or d-axis current.

If the effective (RMS) value of the q-axis or d-axis current transformed in step S300 is larger than the preset reference, the controller 500 decrease the currently-set DC offset for each of the plurality of the current sensors CS by a certain amount. When the effective (RMS) value of the q-axis or d-axis current is decreased, the controller 500 decreases the DC offset by a certain amount until the effective (RMS) value decreases and increases again. Then, the controller 500 replaces the currently-set DC offsets with a DC offset corresponding to the smallest effective (RMS) value of the q-axis or d-axis current.

If the effective (RMS) value of the q-axis or d-axis current transformed in step S300 is larger than the preset reference, the controller 500 decreases the currently-set DC offset for each of the plurality of the current sensors CS by a certain amount. When the effective (RMS) value of the q-axis or d-axis current is increased, the controller 500 increases the currently-set DC offset of each of the current sensors CS of the current detector 200 by a certain amount.

When the effective (RMS) value of the q-axis or d-axis current is decreased, the controller 500 increases the DC offset by a certain amount until the effective (RMS) value decreases and increases again. Then, the controller 500 replaces the currently-set DC offsets with a DC offset corresponding to the smallest effective (RMS) value of the q-axis or d-axis current.

In this manner, the controller 500 replaces the currently-set DC offsets with a new DC offset corresponding to the smallest effective (RMS) value by adjusting (increasing or decreasing) the DC offset for each of the current sensors CS. A sequence of increasing or decreasing the currently-set DC offset by for each of the current sensors CS of the current detector 200 may vary depending on a user's choice.

If the effective (RMS) value of the d-axis and/or q-axis current transformed in step S300 is smaller than the preset reference, the controller 500 maintains the currently-set DC offsets for the current sensors CS (step S600).

As described above, when the three-phase current is transformed into the d-q axis current, it seems like a DC current if torque does not change abruptly. When the current offset is not measured at a position where actually current is 0 A, the d-axis and/or q-axis currents may have a pulsation.

For this reason, the controller 500 may extract the pulsation, that is, a high frequency component using the filter 300, i.e., a HPF. Then, the controller 500 adjusts the current offset to update the current offset with a new offset corresponding to a smallest RMS of the pulsation.

Specifically, the controller 500 extracts the pulsation component by allowing the d-axis and/or q-axis current to pass through the HPF. An effective (RMS) value of the pulsation component is used as the magnitude thereof. When the effective (RMS) value of the pulsation component is smaller than or equal to the preset reference, it is determined that each current sensor CS of the current detect 200 has a normal DC offset. The control continues.

On the other hand, when the effective (RMS) value of the pulsation component is larger than the preset reference, the controller 500 changes each of the current sensors CS offsets sequentially. This is because it is not known which one of the current sensors CS in respective phases has an abnormal offset related to the pulsation component.

For example, the controller 500 changes the offset of the current sensor CS disposed in phase-a, for example, increases or decreases the offset to find out a new offset corresponding to the smallest RMS of the pulsation component. Then, the controller 500 repeats the process for the phase-b and/or phase-c. The controller 500 applies the new offset to the current sensors CS disposed in respective phases, to control it. In this manner, the DC offset of each of the current sensors CS of the current detector 200 can be corrected while the electric motor 10 is being driven.

As set forth above, according to exemplary embodiments of the present disclosure, a pulsation in an output torque in controlling an electric motor can be effectively prevented in such a manner that a DC offset of a current sensor is corrected while the electric motor is being driven, which may cause the pulsation in the output torque when a current is measured using the current sensor.

Although exemplary embodiments of the present disclosure have been disclosed for illustrative purposes, those skilled in the art will appreciate that various modifications, additions and substitutions are possible, without departing from the scope and spirit of the disclosure as defined by the accompanying claims. Accordingly, such modifications, additions and substitutions should also be understood to fall within the scope of the present disclosure.

What is claimed is:

1. An apparatus for converting an offset of a current sensor, comprising:
    an inverter configured to convert a DC power into a three-phase AC current to supply it to an electric motor;

a current detector comprising a plurality of current sensors configured to sense current output from the inverter;

a filter configured to transform the current sensed by the current detector into a d-axis or q-axis current and to filter the transformed d-axis or q-axis current to extract a high frequency component;

a RMS (root mean square) calculator configured to convert the high frequency component extracted from the filter into an effective (RMS) value; and a controller configured to, if the effective (RMS) value of the d-axis or q-axis current transformed by the RMS calculator is larger than a preset reference, obtain a DC offset corresponding to the smallest one of the effective (RMS) values of the d-axis or q-axis and correct each of the current sensors using the obtained DC offset, wherein the controller obtains the DC offset corresponding to the smallest one of the effective (RMS) values of the d-axis or q-axis by repeatedly increasing or decreasing a currently-set DC offset of each of the current sensors by a certain amount until the effective (RMS) values of the d-axis or q-axis gradually decreases and then increases.

2. The apparatus of claim 1, wherein at least two of the three-phase AC currents output from the inverter have their respective current sensors.

3. The apparatus of claim 1, wherein the filter comprises a high pass filter (HPF).

4. The apparatus of claim 1, wherein the controller is further configured to maintain the currently-set DC offsets if the effective (RMS) value is smaller than the preset reference.

* * * * *